United States Patent
Mann

(10) Patent No.: US 9,442,386 B2
(45) Date of Patent: Sep. 13, 2016

(54) IMAGING OPTICS

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 442 days.

(21) Appl. No.: 13/006,025

(22) Filed: Jan. 13, 2011

(65) Prior Publication Data

US 2011/0122384 A1    May 26, 2011

Related U.S. Application Data

(63) Continuation of application No. PCT/EP2009/004429, filed on Jun. 18, 2009.

(60) Provisional application No. 61/081,147, filed on Jul. 16, 2008.

(30) Foreign Application Priority Data

Jul. 16, 2008 (DE) ........................ 10 2008 033 340

(51) Int. Cl.
*G03F 7/20* (2006.01)
*G02B 17/06* (2006.01)

(52) U.S. Cl.
CPC ....... *G03F 7/70233* (2013.01); *G02B 17/0663* (2013.01)

(58) Field of Classification Search
CPC ........................ G03F 7/70216; G03F 7/70233
USPC .......................................................... 355/67
See application file for complete search history.

(56) References Cited

U.S. PATENT DOCUMENTS

| 4,861,148 A | 8/1989 | Sato et al. |
| 6,213,610 B1 | 4/2001 | Takahashi et al. |
| 7,186,983 B2 | 3/2007 | Mann et al. |
| 2002/0176063 A1 | 11/2002 | Omura |
| 2003/0147149 A1 | 8/2003 | Terasawa |
| 2004/0051852 A1 | 3/2004 | Komatsuda et al. |

(Continued)

FOREIGN PATENT DOCUMENTS

| DE | 10 2005 042 005 | 7/2005 |
| EP | 1 093 021 A2 | 4/2001 |

(Continued)

OTHER PUBLICATIONS

International Search Report for corresponding PCT Application No. PCT/EP2009/004429, dated Oct. 19, 2009.

(Continued)

*Primary Examiner* — Michelle M Iacoletti
(74) *Attorney, Agent, or Firm* — Fish & Richardson P.C.

(57) ABSTRACT

An imaging optics has a plurality of mirrors to image an object field in an object plane into an image field in an image plane. At least one of the mirrors has a through opening for the passage of imaging light. An arrangement of the mirrors is such that principal rays run parallel or divergently in the beam path of the imaging light between the object plane and the first downstream mirror. The imaging optics can have an entrance pupil plane that lies in the beam path of the imaging light in the range of between 5 m and 2000 m in front of the object plane. The imaging optics can have an entrance pupil plane that lies in the beam path of the imaging light in the range of between 100 mm and 5000 mm in front of the object plane. Imaging optics with improved imaging quality are provided.

24 Claims, 4 Drawing Sheets

(56) References Cited

U.S. PATENT DOCUMENTS

| | | |
|---|---|---|
| 2006/0232867 A1 | 10/2006 | Mann et al. |
| 2006/0284113 A1 | 12/2006 | Chang et al. |
| 2007/0058269 A1 | 3/2007 | Mann et al. |
| 2007/0223112 A1 | 9/2007 | Mann et al. |
| 2008/0118849 A1* | 5/2008 | Chandhok et al. ............ 430/5 |
| 2008/0170310 A1 | 7/2008 | Mann |

FOREIGN PATENT DOCUMENTS

| | | |
|---|---|---|
| EP | 1 450 196 A1 | 8/2004 |
| EP | 1 452 899 A1 | 9/2004 |
| EP | 1 806 610 A1 | 7/2007 |
| JP | 2001-185480 | 7/2001 |
| JP | 2003-233005 | 8/2003 |
| JP | 2004-031808 | 1/2004 |
| WO | WO 2007/115597 | 10/2007 |
| WO | WO 2007115596 A1 * | 10/2007 |

OTHER PUBLICATIONS

German Examination Report for corresponding Appl. No. DE 10 2008 033 340.9, dated Feb. 11, 2009, with English translation.
Chinese office Action, with English translation, issued in corresponding Chinese Application No. 200980127410.X.
Chinese office action, with English translation thereof, for CN Appl No. 2009 8012 7410.X, dated Mar. 7, 2012.
Chinese office action, with English translation thereof, for CN Appl No. 2009 8012 7410.X, dated Aug. 3, 2012.
Japanese office action, with English translation thereof, for JP Appl No. 2011-517 767, dated Aug. 25, 2013.
Korean Intellectual Property Office, Office Action for corresponding KR Application No. 10-2011-7001068 dated Aug. 21, 2015, with English translation.

* cited by examiner

IMAGING OPTICS

CROSS-REFERENCE TO RELATED APPLICATIONS

This application is a continuation of, and claims benefit under 35 USC 120 to, international application PCT/EP2009/004429, filed Jun. 18, 2009, which claims benefit of German Application No. 10 2008 033 340.9, filed Jul. 16, 2008 and U.S. Ser. No. 61/081,147, filed Jul. 16, 2008. International application PCT/EP2009/004429 is hereby incorporated by reference in its entirety.

FIELD

The disclosure relates to an imaging optics, in particular to an imaging optical unit, including a plurality of mirrors which image an object field in an object plane into an image field in an image plane, wherein at least one of the mirrors has a through opening for the passage of imaging light, including an arrangement of the mirrors such that principal rays run parallel or divergently in the beam path of the imaging light between the object plane and the first downstream mirror. Furthermore, the disclosure relates to an optical system including an imaging optics of this type, to a projection exposure apparatus including an optical system of this type, to a method for producing a micro- or nanostructured component via a projection exposure apparatus of this type, and to a micro- or nanostructured component produced by this method.

BACKGROUND

Imaging optics, in particular as projection optical units as part of projection exposure apparatuses for microlithography are known from EP 1 093 021 A2, DE 10 2005 042 005 A1, US 2006/0284113 A1, US 2006/0232867 A1, EP 1 450 196 A1, EP 1 452 899 A1, EP 1 806 610 A1 and U.S. Pat. No. 6,213,610 B1.

SUMMARY

The disclosure provides imaging optics with good imaging quality.

In some embodiments, an imaging optics has an entrance pupil plane that lies in the beam path of the imaging light in the range of between 5 m and 2000 m in front of the object plane.

This arrangement of the entrance pupil plane results in a beam path having minimal divergence between the object plane and the first mirror of the projection optical unit. Location-dependent shadow effects on structures to be imaged which are arranged in the object field can thereby be avoided. In addition, in the region of the object plane a practically telecentric beam path results, with corresponding advantages. By way of example, the practically telecentric beam path permits a refocusing of the system in the object plane without the imaging scale changing as a result. In this aspect of the disclosure, the distance between the entrance pupil plane and the object plane can lie in particular in the range of between 100 m and 2000 m (e.g., between 500 m and 1500 m, between 800 m and 1200 m, in the region of 1000 m).

The imaging optics can have an image-side numerical aperture in the range of between 0.4 and 0.9, and in particular an image-side numerical aperture of 0.5. The image-side numerical aperture can also have a value of 0.4, 0.6, 0.7, 0.8 or 0.9. A correspondingly high spatial resolution of the imaging optics results.

In accordance with a further aspect, an imaging optics has an entrance pupil plane that lies in the beam path of the imaging light in the range of between 100 mm and 5000 mm in front of the object plane. The advantages of such an imaging optics, with regard to the location-dependent shadow effects avoided, correspond to those explained above in connection with the first aspect of the disclosure. In addition, in the case of such an imaging optics, the number of components involved to illuminate the object field in an illumination optics arranged upstream of the projection optical unit in the beam path can be reduced, with the result that the overall losses of illumination light are reduced. A distance between entrance pupil plane and the object plane in the range of between 100 mm and 5000 mm, with regard to the arrangement of a component of the illumination optics directly in the region of the entrance pupil plane, has been found to be particularly advantageous for producing a compact optical arrangement. In particular, the distance between the entrance pupil plane and the object plane is between 100 m and 2000 mm (e.g., between 500 mm and 1500 mm, between 800 mm and 1200 mm, in the region of 1000 mm). In this further aspect of the disclosure, a reflection surface of at least one mirror of the imaging optics is embodied as a freeform surface that cannot be described by a rotationally symmetrical function. The use of freeform surfaces instead of reflection surfaces having an axis of rotational symmetry produces new degrees of design freedom, which leads to imaging optics having combinations of properties that were not able to be realized with rotationally symmetrical reflection surfaces. Freeform surfaces suitable for use in imaging optics according to the disclosure are known from US 2007-0058269 A1.

The imaging optics in accordance with both aspects can have an object-image offset that is greater than 100 mm, in particular greater than 200 mm.

An image-side numerical aperture in the range of between 0.4 and 0.9, and in particular an image-side numerical aperture of 0.7, of the imaging optics leads to a particularly good structure resolution. The image-side numerical aperture can also have a value of 0.4, 0.5, 0.6, 0.8 or 0.9.

The image plane of the imaging optics can be arranged parallel to the object plane. This facilitates the integration of the imaging optics into a structural environment. This advantage is manifested particularly when the imaging optics is used in a scanning projection exposure apparatus, since the scan directions can then be led parallel to one another.

If the imaging optics has exactly six mirrors, this leads to an imaging optics which is simultaneously compact and well corrected with regard to its imaging aberrations.

The imaging optics can illuminate an image field that is larger than 1 mm$^2$. The image field can in particular be rectangular or curved and have an aspect ratio x/y of 13 mm/1 mm. Such an image field leads to a good throughput when the imaging optics is used in a projection exposure apparatus.

The imaging optics can be telecentric on the image side. This permits, by way of example, a refocusing of the system in the image plane without the imaging scale changing as a result, and thus increases the application flexibility of the imaging optics.

The advantages of an optical system having such imaging optics and of a projection exposure apparatus including such an optical system correspond to those explained above with regard to the imaging optics according to the disclosure.

The light source of the projection exposure apparatus can be embodied in broadband fashion and have for example a bandwidth that is greater than 1 nm, greater than 10 nm or greater than 100 nm. In an exemplary embodiment of an EUV light source, useful light having a central wavelength of 13.5 nm and a bandwidth of 2% around this central wavelength (FWHM) arrives in the image field. The remaining bandwidth of the light generated by the EUV light source is only weakly reflected by the mirrors of the imaging optics. The projection exposure apparatus can be embodied in such a way that it can be operated with light sources having different wavelengths. An illumination optics with a pupil facet mirror is known for example from US 2007/0223112 A1.

Corresponding advantages apply to a production method using such a projection exposure apparatus and to a micro- or nanostructured component produced thereby.

BRIEF DESCRIPTION OF THE DRAWINGS

Exemplary embodiments of the disclosure are explained in more detail below with reference to the drawing, in which.

DETAILED DESCRIPTION

Figure 1:
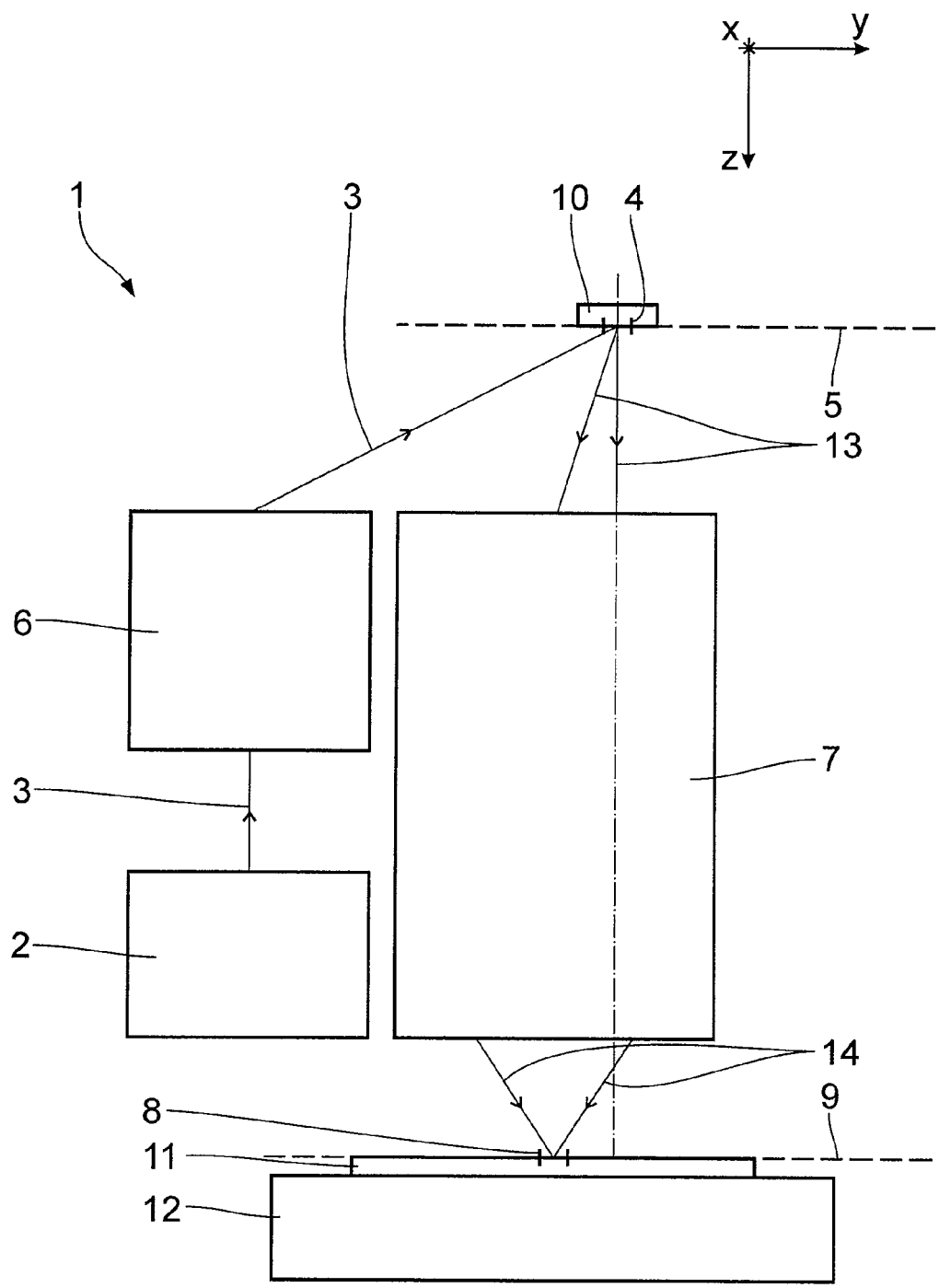
FIG. 1 schematically shows a projection exposure apparatus for microlithography.

A projection exposure apparatus 1 for microlithography has a light source 2 for illumination light. The light source 2 is an EUV light source that generates light in a wavelength range of between 5 nm and 30 nm. Other EUV wavelengths are also possible. In general, even arbitrary wavelengths, e.g. visible wavelengths, are possible for the illumination light guided in the projection exposure apparatus 1. A beam path of the illumination light 3 is illustrated extremely schematically in FIG. 1.

An imaging optics being embodied as an illumination optical unit 6 serves for guiding the illumination light 3 toward an object field 4 in an object plane 5. An imaging or projection optics being embodied as an imaging or projection optical unit 7 is used to image the object field 4 into an image field 8 in an image plane 9 with a predetermined demagnification scale. The projection optical unit 7 demagnifies by a factor of 8.

Figure 2:
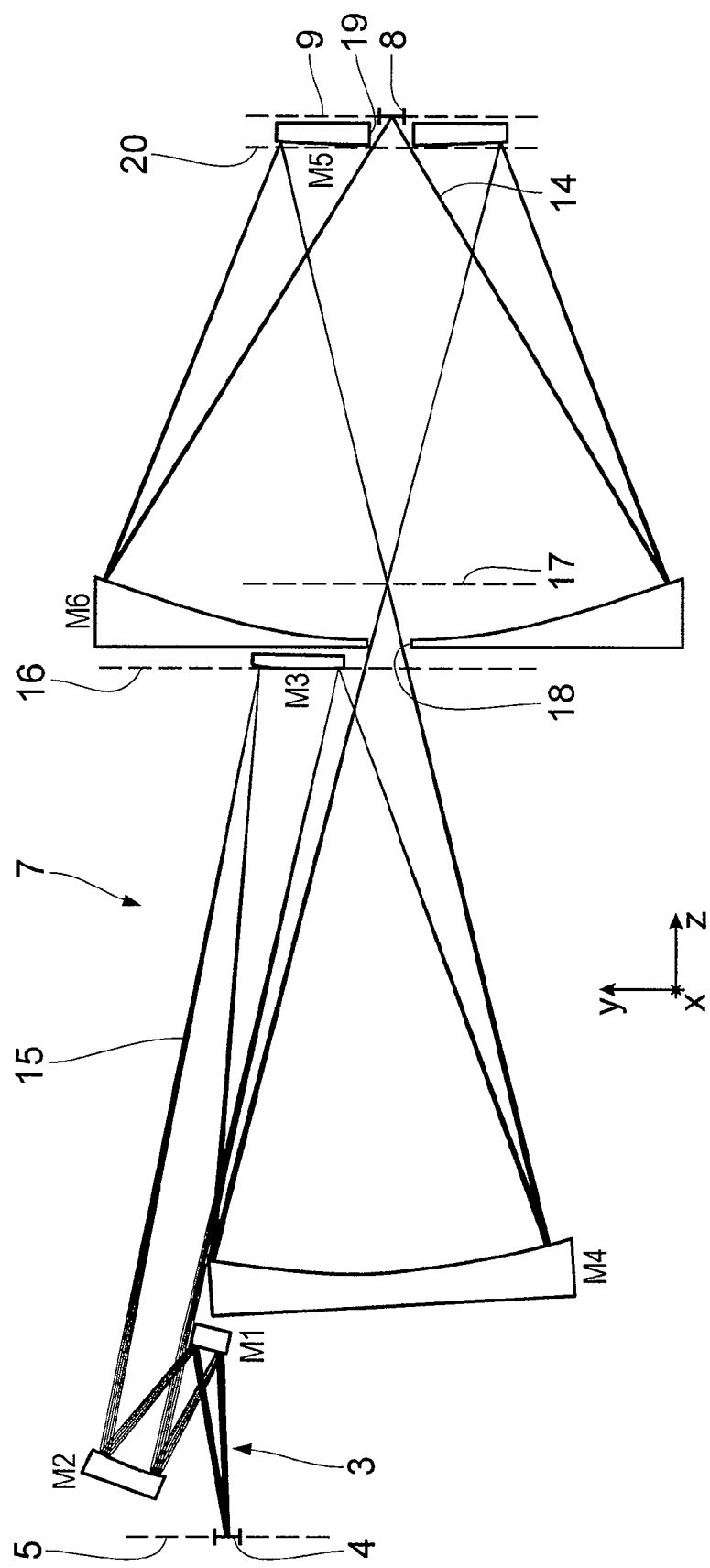
FIG. 2 shows a meridional section including imaging beam paths of field points spaced apart from one another, through an embodiment of an imaging optics being embodied as a projection optical unit of the projection exposure apparatus according to FIG. 1.

Other imaging scales are likewise possible, for example 4×, 5×, 6× or else imaging scales that are greater than 8×. For illumination light having an EUV wavelength, an imaging scale of 8× is suitable, in particular, since the object-side angle of incidence on a reflection mask can thereby be kept small. For an image-side aperture of the projection optical unit 7 of NA=0.5, illumination angles of less than 6° can be realized on the object side. In addition, an imaging scale of 8× does not lead to the necessity of using unnecessarily large masks. The image plane 9 is arranged parallel to the object plane 5 in the case of the projection optical unit 7. A portion of a reflective mask 10 (also referred to as a reticle) which coincides with the object field 4 is imaged in this case. The imaging is effected onto the surface of substrate 11 in the form of a wafer that is carried by a substrate holder 12. FIG. 1 schematically illustrates, between the reticle 10 and the projection optical unit 7, a beam bundle 13 of the illumination light 3 that enters into the projection optical unit, and, between the projection optical unit 7 and the substrate 11, a radiation bundle 14 of the illumination light 3 that emerges from the projection optical unit 7. The image-field-side numerical aperture NA of the projection optical unit 7 according to FIG. 2 is 0.50. The projection optical unit 7 is telecentric on the image side.

In order to facilitate the description of the projection exposure apparatus 1, a system of Cartesian xyz coordinates is indicated in the drawing, and reveals the respective positional relationship of the components illustrated in the figures. In FIG. 1, the x direction runs perpendicularly to the plane of the drawing into the latter, the y direction runs toward the right and the z direction runs downward.

The projection exposure apparatus 1 is of the scanner type. Both the reticle 10 and the substrate 11 are scanned in the y direction during operation of the projection exposure apparatus 1.

FIG. 2 shows the optical design of the projection optical unit 7. The illustration shows the beam path in each case of two individual beams 15 proceeding from five object field points that lie one above another in FIG. 2 and spaced apart from one another in the y direction, wherein the two individual beams 15 associated with one of the five object field points are assigned in each case to two different illumination directions for the five object field points. These two illumination directions are represented by the upper coma beam and the lower coma beam of each of the five object field points.

Proceeding from the object plane 5, the individual beams 15 are firstly reflected by a first mirror M1 and subsequently by further mirrors, which are designated as mirrors M2, M3, M4, M5 and M6 hereinafter in the order of the beam path. The projection optical unit 7 according to FIG. 2 therefore has six reflective mirrors. These mirrors bear a coating that is highly reflective to the wavelength of the illumination light 3 if this is desired on account of the wavelength, for example in the EUV. Radiations having wavelengths that differ greatly from one another can also be guided in the illumination optics 6 and the projection optical unit 7 since these optical units have substantially achromatic properties. It is therefore possible for example to guide an alignment laser or to operate an autofocusing system in these optical units, wherein at the same time a wavelength that differs greatly from the operating wavelength thereof is employed for the illumination light. Thus, an alignment laser can operate at 632.8 nm, at 248 nm or at 193 nm, while illumination light in the range of between 10 and 30 nm is employed at the same time.

The mirror M3 has a convex basic shape, that is to say can be described by a convex best-matched surface. In the description hereinafter, mirrors of this type are referred to in simplified fashion as convex, and mirrors that can be described by a concavely best-matched surface are referred to in simplified fashion as concave. The convex mirror M3 provides for a good Petzval correction in the projection optical unit 7.

An entrance pupil plane of the projection optical unit 7 according to FIG. 2 lies 1000 m in front of the object plane 5 in the beam path of the illumination light 3. The projection optical unit 7 according to FIG. 2 has a structural length, that is to say a distance between the object plane 5 and the image plane 9, of 2000 mm.

Those individual beams 15 which proceed from spaced-apart object field points and are assigned to the same illumination direction thus run between the object plane 4 and the first mirror M1 in virtually parallel fashion into the projection optical unit 7. The principal rays of the individual beams 15 thus form an angle of virtually 0° with respect to one another in the beam path of the illumination light 3 between the object plane 5 and the mirror M1.

The individual beams 15 associated with a specific illumination direction of the five object field points are combined in a pupil plane 16 of the projection optical unit 7, adjacent to which the mirror M3 is arranged. The the mirror M3 is therefore also referred to as pupil mirror. An aperture diaphragm for delimiting the illumination light beam bundle can be arranged in the pupil plane 16. The aperture diaphragm can be provided via a mechanical and interchangeable diaphragm or else in the form of a corresponding coating directly on the mirror M3.

The mirrors M1 to M4 image the object plane 5 into an intermediate image plane 17. The intermediate-image-side numerical aperture of the projection optical unit 7 is approximately 0.2. The mirrors M1 to M4 form a first partial imaging optical unit of the projection optical unit 7 with a demagnifying imaging scale of approximately 3.2×. The downstream mirrors M5 and M6 form a further partial imaging optical unit of the projection optical unit 7 with a demagnifying imaging scale of approximately 2.5×. In the beam path of the illumination light 3 between the mirrors M4 and M5 upstream of the intermediate image plane 17 and adjacent thereto, a through opening 18 is formed in the mirror M6, through which opening the illumination or imaging light 3 passes upon reflection from the fourth mirror M4 to the fifth mirror M5. The fifth mirror M5 in turn has a central through opening 19, through which the radiation bundle 14 passes between the sixth mirror M6 and the image plane 9.

The fifth mirror M5, which together with the sixth mirror M6 images the illumination or imaging light 3 from the intermediate image plane 17 into the image plane 9, is arranged in proximity to a further pupil plane 20 of the projection optical unit 7, which further pupil plane is conjugate with respect to the first pupil plane 16. The further pupil plane 20 in the beam path of the imaging light lies adjacent to the fifth mirror M5, such that a physically accessible diaphragm plane exists at the location of the further pupil plane 20. In the diaphragm plane, an aperture diaphragm can alternatively or additionally likewise be arranged, as described above in connection with the aperture diaphragm in the region of the pupil plane 16.

The projection optical unit 7 has an obscuration diaphragm arranged in centered fashion in one of the pupil planes 16, 20. The partial beams of the projection beam path which are assigned to the central through openings 18, 19 in the mirrors M6, M5 are thereby obscurated. Therefore, the design of the projection optical unit 7 is also referred to as a design with central pupil obscuration.

A distinguished individual beam 15 that links a central object field point to a centrally illuminated point in the entrance pupil of the projection optical unit 7 is also referred to as the principal ray of a central field point. The principal ray of the central field point, starting from the reflection at the sixth mirror M6, forms approximately a right angle with the image plane 9, that is to say runs approximately parallel to the z axis of the projection exposure apparatus 1. The angle is greater than 85°.

The image field 8 is rectangular. The image field 8 has an extent of 13 mm parallel to the x direction. The image field 8 has an extent of 1 mm parallel to the y direction. The image field 8 lies centrally behind the fifth mirror M5. The radius R of the through opening 19 has to satisfy the following relation for vignetting-free imaging:

$$R \geq \frac{1}{2} \cdot D + d_w \cdot NA$$

In this case, D is the diagonal of the image field 8. $d_w$ is the free working distance of the mirror M5 from the image plane. The free working distance is defined as the distance between the image plane 9 and the section closest thereto of a utilized reflection surface of the closest mirror of the projection optical unit 7, that is to say of the mirror M5 in the embodiment according to FIG. 2. NA is the image-side numerical aperture.

All six mirrors M1 to M6 of the projection optical unit 7 are embodied as freeform surfaces which cannot be described by a rotationally symmetrical function. Other embodiments of the projection optical unit 7 are also possible in which at least one of the mirrors M1 to M6 has a freeform reflection surface of this type.

A freeform surface of this type can be produced from a rotationally symmetrical reference surface. Freeform surfaces of this type for reflection surfaces of the mirrors of projection optical units of projection exposure apparatuses for microlithography are known from US 2007-0058269 A1.

The freeform surface can be described mathematically by the following equation:

$$Z = \frac{cr^2}{1 + \sqrt{1 - (1+k)c^2 r^2}} + \sum_{j=2}^{66} C_j X^m Y^n$$

where the following holds true:

$$j = \frac{(m+n)^2 + m + 3n}{2} + 1$$

Z is the sagitta of the freeform surface at the point x, y ($x^2 + y^2 = r^2$).

c is a constant corresponding to the vertex curvature of a corresponding asphere. k corresponds to a conical constant of a corresponding asphere. $C_j$ are the coefficients of the monomials $X^m Y^n$. The values of c, k and $C_j$ are typically determined on the basis of the desired optical properties of the mirror within the projection optical unit 7. The order of the monomial, m+n, can be varied as desired. A higher-order monomial can lead to a design of the projection optical unit with better image aberration correction, but is more complex to calculate. m+n can assume values of between 3 and more than 20.

Freeform surfaces can also be described mathematically by Zernike polynomials which are explained for example in the manual of the optical design program CODE V®. Alternatively, freeform surfaces can be described with the aid of two-dimensional spline surfaces. Examples thereof are Bezier curves or non-uniform rational basis splines (NURBS). Two-dimensional spline surfaces can be described for example by a network of points in an xy plane and associated z values or by these points and gradients associated with them. Depending on the respective type of spline surface, the complete surface is obtained by interpolation between the network points using e.g. polynomials or functions which have specific properties with regard to their continuity and differentiability.

The mirrors M1 to M6 bear multiple reflection layers in order to optimize their reflection for the impinging EUV illumination light 3. The reflection is all the better, the closer the impingement angle of the individual beams 15 on the mirror surface is to perpendicular incidence. The projection optical unit 7 has small reflection angles overall for all individual beams 15.

The optical design data of the reflection surfaces of the mirrors M1 to M6 of the projection optical unit 7 can be gathered from the tables below. The first of these tables specifies, with respect to the optical surfaces of the optical components and with respect to the aperture diaphragm, in each case the reciprocal of the vertex curvature (radius) and a distance value (thickness) corresponding to the z distance between adjacent elements in the beam path, proceeding from the object plane. The second table specifies the coefficients $C_j$ of the monomials $X^m Y^n$ in the freeform surface equation specified above for the mirrors M1 to M6. In this case, Nradius represents a normalization factor. After the second table, the magnitude in mm along which the respective mirror, proceeding from a mirror reference design, was decentered (Y-decenter) and rotated (X-rotation) is also specified. This corresponds to the parallel displacement and the tilting in the case of the freeform surface design method described above. In this case, displacement is effected in the y direction and tilting is effected about the x axis. In this, the angle of rotation is specified in degrees.

An object image offset, that is to say a distance between a projection of the midpoint of the object field 4 onto the image plane 9 and the midpoint of the image field 8, is 208 mm in the case of the projection optical unit 7.

Figure 3:
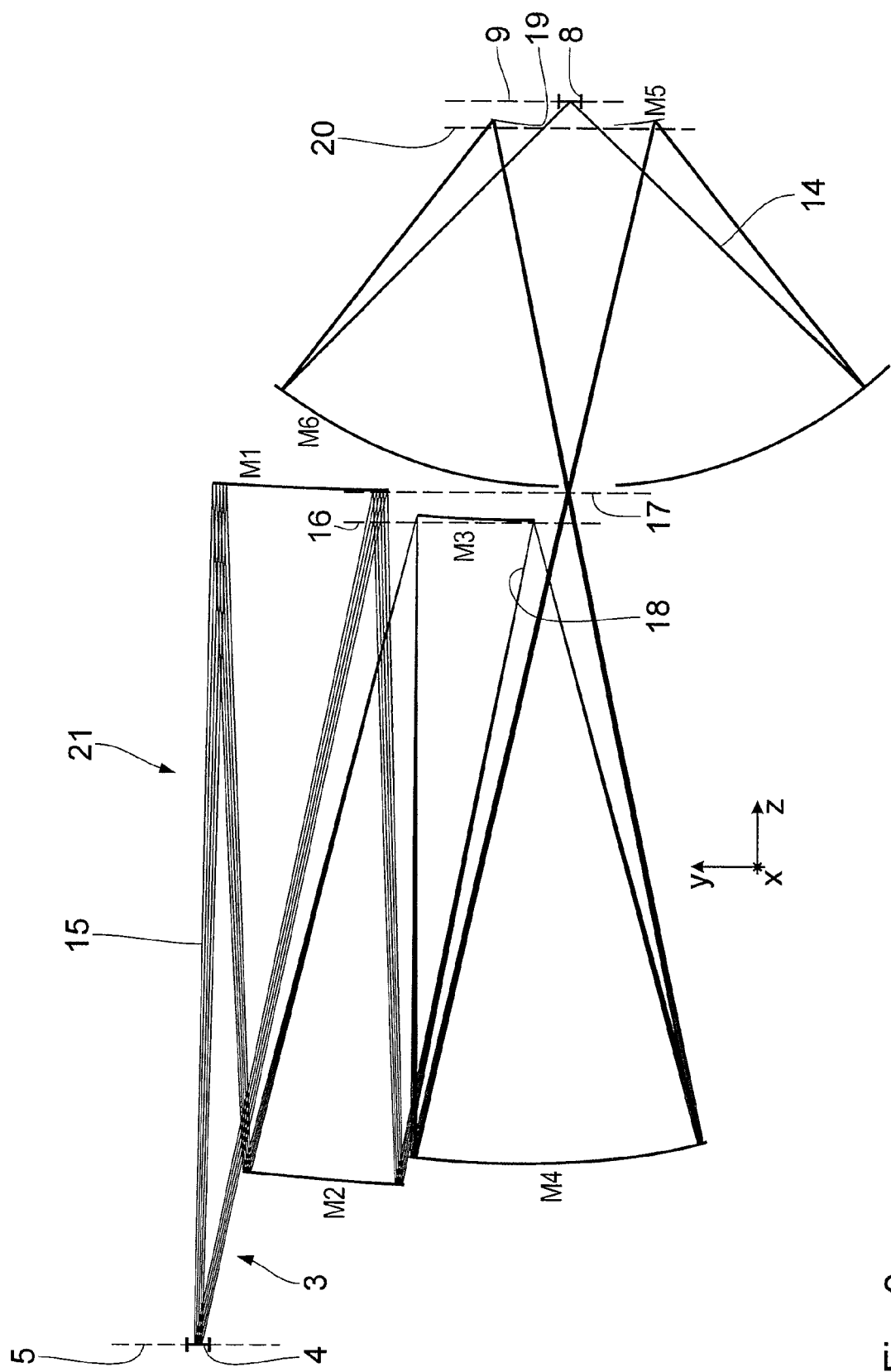
FIG. 3 shows an illustration similar to FIG. 2 of a further embodiment of a projection optical unit.

FIG. 3 shows a further embodiment of a projection optical unit 21, which can be used instead of the projection optical unit 7 according to FIG. 2 in the projection exposure apparatus 1. Components or reference variables corresponding to those which have already been explained above with reference to FIGS. 1 and 2 bear the same reference numerals and are not discussed in detail again.

The projection optical unit 21, too, has a total of six reflective mirrors designated as mirrors M1 to M6 proceeding from the object plane 5 in the sequence of the beam path of the illumination light 3. The mirrors M1 to M6 all have reflection free form surfaces which cannot be described by a rotationally symmetrical function.

The projection optical unit 21 demagnifies by a factor of 8. The projection optical unit 21 has an image-side numerical aperture NA of 0.70. The dimensions of the image field 8 of the projection optical unit 21 correspond to those of the projection optical unit 7. An intermediate-image-side numerical aperture is approximately 0.2.

The projection optical unit 21 has a structural length, that is to say a distance between the object plane 5 and the image plane 9, of 1.429 mm.

An object-image offset is significantly larger in the case of the projection optical unit 21 than in the case of the projection optical unit 7, and is 389 mm in the case of the projection optical unit 21.

An entrance pupil plane lies 1000 mm in front of the object plane 5 in the beam path of the illumination light 3 in the case of the projection optical unit 21. Between the object plane 5 and the mirror M1, the individual beams 15 assigned to different object field points but to the same illumination direction thus run divergently with respect to one another.

The optical design data of the reflection surfaces of the mirrors M1 to M6 of the projection optical unit 21 can be gathered from the tables below, the structure of which corresponds to that of the tables concerning the projection optical unit 7 according to FIG. 2.

| Surface | Radius | Distance value | Operating mode |
|---|---|---|---|
| Object plane | Infinity | 263.973 | |
| M 1 | 294.632 | −163.973 | REFL |
| M 2 | 677.341 | 1121.158 | REFL |
| M 3 | 318.925 | −848.002 | REFL |
| M 4 | 396.851 | 1586.844 | REFL |
| M 5 | 1610.696 | −697.387 | REFL |
| M 6 | 951.407 | 737.387 | REFL |
| Object plane | Infinity | 0.000 | |

| Coefficient | M1 | M2 | M3 | M4 | M5 | M6 |
|---|---|---|---|---|---|---|
| K | −1.107380E+00 | −6.922178E−01 | 4.604190E−01 | −9.070490E−01 | 1.921763E+01 | 3.351539E−01 |
| Y | 0.000000E+00 | 0.000000E+00 | 0.000000E+00 | 0.000000E+00 | 0.000000E+00 | 0.000000E+00 |
| X2 | −1.128522E−03 | −1.453589E−04 | −6.996584E−04 | −7.777355E−04 | −1.436342E−04 | 3.354789E−05 |
| Y2 | −1.159973E−03 | −1.432548E−04 | −6.658993E−04 | −7.779247E−04 | −1.460604E−04 | 3.345270E−05 |
| X2Y | −8.685192E−08 | 9.438147E−09 | 2.709788E−07 | 4.768829E−10 | 1.219803E−09 | 7.494169E−10 |
| Y3 | −5.480818E−08 | 1.821581E−08 | 3.081899E−07 | 4.735357E−10 | 2.179734E−09 | 7.185939E−10 |
| X4 | 0.000000E+00 | 0.000000E+00 | −3.510369E−09 | −6.986158E−11 | 4.809903E−10 | 9.888892E−13 |
| X2Y2 | 0.000000E+00 | 0.000000E+00 | −7.066022E−09 | −1.393082E−10 | 9.641836E−10 | 1.778472E−12 |
| Y4 | 0.000000E+00 | 0.000000E+00 | −3.551286E−09 | −6.941280E−11 | 4.830886E−10 | 7.836027E−13 |
| Nradius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image plane |
|---|---|---|---|---|---|---|---|
| Y-decenter | 131.752 | 232.510 | 15.389 | −92.550 | −104.036 | −104.318 | 0.000 |
| X-rotation | −12.787 | −21.267 | −1.854 | 3.418 | −0.205 | 0.032 | 0.000 |

| Surface | Radius | Distance value | Operating mode |
|---|---|---|---|
| Object plane | Infinity | 947.942 | |
| M 1 | −1581.47 | −747.942 | REFL |
| M 2 | 577.16 | 748.042 | REFL |
| M 3 | 425.57 | −700.201 | REFL |
| M 4 | 772.53 | 1151.325 | REFL |
| M 5 | 427.11 | −411.086 | REFL |
| M 6 | 511.79 | 441.061 | REFL |
| Image plane | Infinity | 0.000 | |

| Coefficient | M1 | M2 | M3 | M4 | M5 | M6 |
|---|---|---|---|---|---|---|
| K | −7.820672E+00 | −9.963966E−01 | −1.359168E+01 | −1.317846E−01 | 6.539022E+00 | 1.788927E−01 |
| Y | 0.000000E+00 | 0.000000E+00 | 0.000000E+00 | 0.000000E+00 | 0.000000E+00 | 0.000000E+00 |
| X2 | 7.587570E−05 | −6.903796E−04 | −3.330612E−04 | −8.115610E−05 | −1.225037E−04 | 2.999865E−05 |
| Y2 | 7.620672E−05 | −8.754364E−04 | −5.464618E−04 | −9.781130E−05 | −1.047356E−04 | 3.638908E−05 |
| X2Y | 1.153232E−07 | −7.509815E−08 | −4.096239E−07 | 1.544335E−07 | 1.068382E−08 | 4.909126E−09 |
| Y3 | −2.680004E−08 | −4.779986E−07 | 4.267754E−07 | 6.372208E−08 | 1.112727E−07 | 4.922187E−09 |
| X4 | −2.136263E−10 | 5.210128E−12 | 4.314907E−08 | −3.473595E−11 | −1.398301E−09 | 6.124286E−12 |
| X2Y2 | −6.832094E−10 | −8.387474E−10 | 4.641481E−08 | 4.986137E−10 | −3.756201E−10 | 4.889670E−12 |
| Y4 | −3.650106E−10 | −1.792083E−09 | 1.421362E−08 | −2.276942E−11 | −1.570266E−10 | −6.742299E−13 |
| X4Y | −2.733767E−13 | 6.076221E−14 | 5.575586E−12 | 2.052887E−13 | 5.813450E−12 | 1.227022E−14 |
| X2Y3 | 2.569784E−13 | −3.305564E−12 | 2.501762E−11 | 1.813602E−12 | 4.127069E−12 | 1.854533E−14 |
| Y5 | 5.383536E−13 | −4.671158E−12 | 4.850910E−11 | 2.823530E−15 | 7.849310E−12 | 1.955096E−14 |
| X6 | 4.513555E−16 | −4.083835E−17 | −3.635906E−15 | −4.536592E−17 | −5.543810E−14 | −4.513033E−18 |
| X4Y2 | 2.349138E−15 | 9.247813E−16 | −1.827375E−12 | 7.048822E−16 | −1.691791E−13 | −2.617095E−17 |
| X2Y4 | 1.221804E−15 | −1.475568E−14 | −2.874053E−12 | 2.536473E−15 | −1.609459E−13 | −2.147640E−17 |
| Y6 | −4.431890E−16 | −8.650187E−15 | −1.269525E−12 | −1.581578E−16 | −5.773591E−14 | −2.503895E−17 |
| X6Y | −1.847900E−18 | −1.387611E−18 | 9.189317E−17 | 3.882953E−19 | −1.080425E−16 | 3.493132E−20 |
| X4Y3 | −3.228227E−18 | 1.481462E−17 | −4.339139E−16 | 2.797715E−18 | 1.002818E−16 | 6.330571E−20 |
| X2Y5 | −2.907362E−18 | −4.256741E−17 | 1.197091E−14 | 1.581265E−18 | 1.613195E−16 | 8.851097E−20 |
| Y7 | 1.595425E−19 | −1.026239E−17 | 5.678497E−15 | −1.058183E−19 | −1.743311E−16 | 2.418894E−20 |
| X8 | 3.017097E−21 | −2.333614E−21 | 1.206529E−26 | 3.322521E−22 | −1.413313E−19 | −2.071045E−23 |
| X6Y2 | 4.014897E−21 | −6.920033E−21 | 8.613745E−17 | 1.476710E−21 | −3.584722E−18 | −1.022439E−22 |
| X4Y4 | −6.487009E−22 | 1.004557E−19 | 2.309165E−16 | 4.795974E−21 | −7.147867E−18 | −9.366656E−23 |
| X2Y6 | 3.456776E−21 | −6.325600E−20 | 2.019543E−17 | −7.071914E−22 | −5.502952E−18 | −1.051734E−22 |
| Y8 | −5.301626E−23 | −1.378802E−21 | −1.904111E−17 | −1.256201E−22 | −1.575181E−18 | 4.756422E−25 |
| X8Y | −2.260764E−23 | 1.439582E−23 | −3.269686E−19 | 2.483217E−24 | −2.672001E−21 | 7.162181E−26 |
| X6Y3 | −1.568705E−24 | 4.062122E−23 | −7.597712E−19 | 3.207123E−24 | 5.172165E−21 | 2.612455E−25 |
| X4Y5 | 2.735891E−24 | 3.975271E−22 | −1.249713E−18 | 4.852746E−24 | −5.043052E−21 | 3.899712E−25 |
| X2Y7 | −2.312484E−24 | 3.601507E−24 | −2.133106E−19 | 3.147427E−25 | −1.379142E−21 | 1.354536E−25 |
| Y9 | −8.447456E−26 | 1.249090E−28 | 7.207007E−20 | 1.151406E−25 | 4.582584E−21 | −6.393761E−27 |
| X10 | 2.121654E−26 | 5.115082E−26 | 1.829021E−21 | 8.096507E−28 | −7.989615E−23 | −3.267135E−29 |
| X8Y2 | 2.738199E−26 | 1.507565E−25 | −8.918687E−21 | 3.057789E−27 | −2.961419E−22 | −4.343045E−28 |
| X6Y4 | −4.763760E−27 | 2.286978E−25 | −4.489181E−21 | 3.115461E−28 | −6.671108E−22 | −1.029638E−27 |
| X4Y6 | 4.202255E−28 | 6.698867E−25 | −1.153880E−21 | −2.859639E−28 | −6.951467E−22 | −1.166672E−27 |
| X2Y8 | −6.862750E−29 | 9.868235E−26 | −2.120520E−22 | 4.286799E−28 | −2.841339E−22 | −5.074033E−28 |
| Y10 | 3.215292E−30 | −4.581670E−26 | −7.814640E−23 | −1.087730E−29 | −6.284965E−23 | −1.471291E−28 |
| Nradius | 1.000000E+00 | 1.000000E+00 | 1.000000E+00 | 0.000000E+00 | 1.000000E+00 | 1.000000E+00 |

| Coefficient | M1 | M2 | M3 | M4 | M5 | M6 | Image plane |
|---|---|---|---|---|---|---|---|
| Y-decenter | −327.769 | 86.524 | −213.237 | 52.226 | −287.973 | −300.503 | 0.000 |
| X-rotation | −11.890 | −5.484 | −0.147 | −16.663 | 1.027 | 2.467 | 0.000 |

Figure 4:
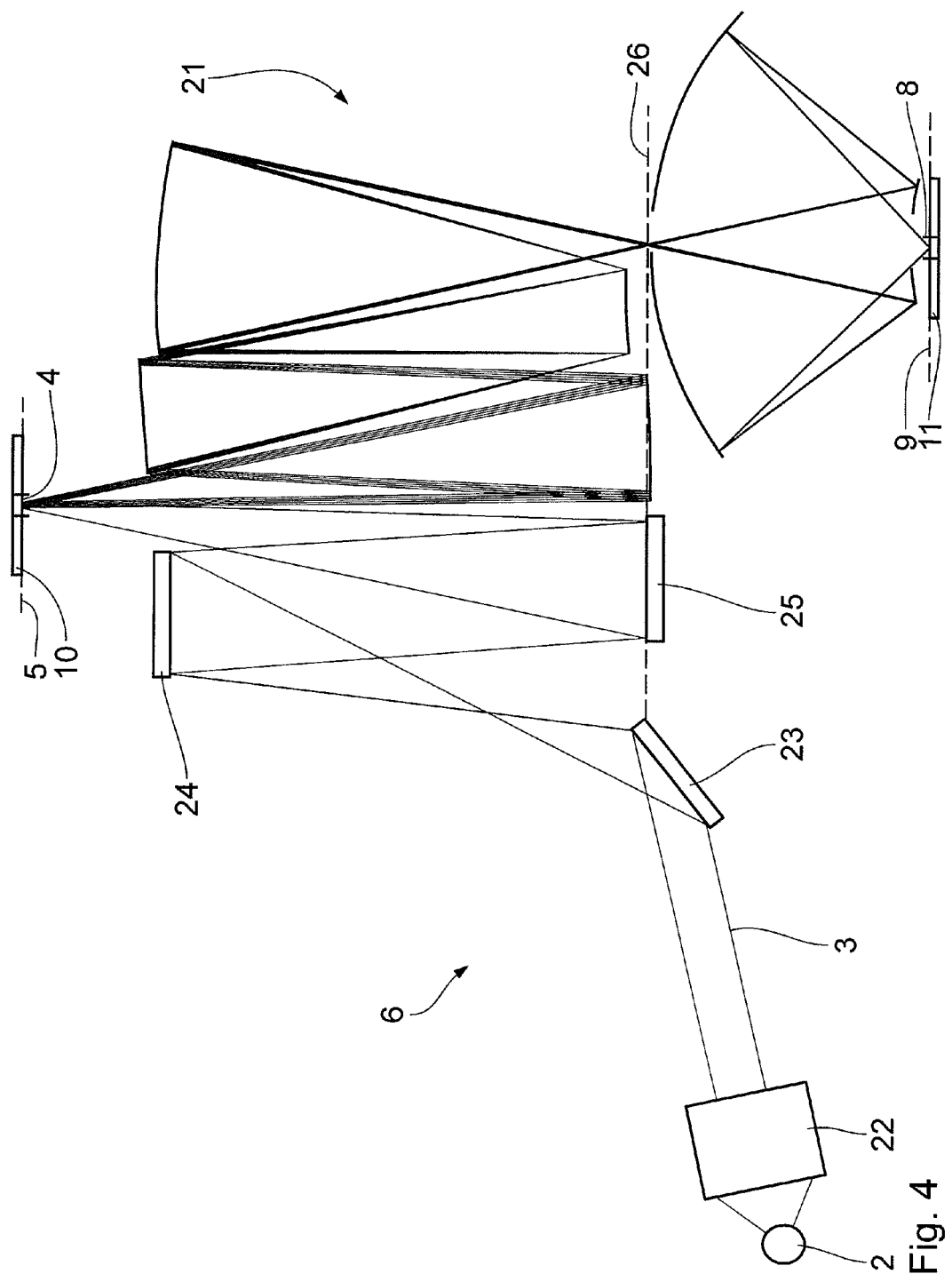
FIG. 4 schematically shows a beam path supplemented by an illumination system of the projection exposure apparatus in a projection exposure apparatus including the projection optical unit according to FIG. 3.

FIG. 4 schematically shows the beam path of the illumination light 3 between the light source 2 and the image field 8 with use of the projection optical unit 21. A collector 22 for collecting the usable emission from the light source 2 is disposed downstream of the light source 2. Disposed downstream of the collector 22 in turn is a spectral filter 23, which is operated with grazing incidence. A field facet mirror 24 is disposed downstream of the spectral filter 23. A pupil facet mirror 25 is disposed downstream of the field facet mirror 24. The concept of such facet mirrors 24, 25 as parts of the illumination optics 6 is known, in principle, from U.S. Pat. No. 7,186,983 B2, for example. The pupil facet mirror 25 is arranged in the region of the entrance pupil plane of the projection optical unit 21, which is indicated by 26 in FIG. 4. There is therefore a distance of approximately 1000 mm between the pupil facet mirror 25 and the object plane 5. The illumination light 3 is directed from the pupil facet mirror 25 directly onto the reflective reticle 10. Therefore, no further component that influences or deflects the illumination light 3 is present between the pupil facet mirror 25 and the reticle 10.

In order to produce a micro- or nanostructured component, in particular a semiconductor component for microelectronics, that is to say a microchip, for example, the following procedure is adopted: the reticle 10 and the wafer 11 are provided. A structure present on the reticle 10 is then projected onto a light-sensitive layer of the wafer 11 with the aid of the projection exposure apparatus 1. A micro- or nanostructure is then produced on the wafer 11 by developing the light-sensitive layer.

What is claimed is:
1. An imaging optics, comprising:
  a plurality of mirrors configured to image an object field in an object plane into an image field in an image plane along a beam path of imaging light, at least one of the mirrors having an opening configured to allow the imaging light to pass therethrough, wherein:
the imaging optics has an entrance pupil plane that lies in the beam path of the imaging light between 5 m and 2000 m in front of the object plane;
the plurality of mirrors are configured to image a center point of the object field into a center point of the image field;
the plurality of mirrors comprises a second to last mirror along the beam path of imaging light;
an axis passes the center of the second to last mirror in a direction perpendicular to the image plane;
the center point of the image field lies on the axis; and
the imaging optics is configured to be used in micro-lithography.

2. The imaging optics of claim 1, wherein the imaging optics has an image-side numerical aperture of between 0.4 and 0.9.

3. The imaging optics of claim 1, wherein the image plane is parallel to the object plane.

4. The imaging optics of claim 1, wherein the imaging optics includes exactly six mirrors.

5. The imaging optics of claim 1, wherein the image field is larger than 1 mm$^2$.

6. The imaging optics of claim 1, wherein the imaging optics is telecentric on the image side.

7. An apparatus, comprising:
an illumination optics; and
an imaging optics of claim 1,
wherein the apparatus is projection exposure apparatus for microlithography.

8. The apparatus of claim 7, wherein the imaging optics further comprises a pupil facet mirror in the entrance pupil plane of the imaging optics.

9. The apparatus of claim 7, further comprising a light source.

10. A method, comprising:
projecting a structure of a reticle onto a light-sensitive layer of a wafer using a projection exposure apparatus to produce a microstructure on the wafer,
wherein the projection exposure apparatus comprises:
an illumination optics; and
an imaging optics of claim 1.

11. The imaging optics of claim 1, wherein the opening is in the second to last mirror.

12. An imaging optics, comprising:
a plurality of mirrors configured to image an object field in an object plane into an image field in an image plane along a beam path of imaging light, at least one of the mirrors having an opening configured to allow the imaging light to pass therethrough,
wherein:
the imaging optics has an entrance pupil plane that lies in the beam path of the imaging light between 100 mm and 5000 mm in front of the object plane;
the plurality of mirrors are configured to image a center point of the object field into a center point of the image field;
the plurality of mirrors comprises a second to last mirror along the beam path of imaging light;
a reflection surface of at least one of the mirrors is a freeform surface;
an axis passes the center of the second to last mirror in a direction perpendicular to the image plane;
the center point of the image field lies on the axis; and
the imaging optics is configured to be used in micro-lithography.

13. The imaging optics of claim 12, wherein the imaging optics has an image-side numerical aperture of between 0.4 and 0.9.

14. The imaging optics of claim 12, wherein the image plane is parallel to the object plane.

15. The imaging optics of claim 12, wherein the imaging optics includes exactly six mirrors.

16. The imaging optics of claim 12, wherein the image field is larger than 1 mm$^2$.

17. The imaging optics of claim 12, wherein the imaging optics is telecentric on the image side.

18. An apparatus, comprising:
an illumination optics; and
an imaging optics of claim 12,
wherein the apparatus is projection exposure apparatus for micro-lithography.

19. The apparatus of claim 18, wherein the imaging optics further comprises a pupil facet mirror in the entrance pupil plane of the imaging optics.

20. The apparatus of claim 18, further comprising a light source.

21. A method, comprising:
projecting a structure of a reticle onto a light-sensitive layer of a wafer using a projection exposure apparatus to produce a microstructure on the wafer,
wherein the projection exposure apparatus comprises:
an illumination optics; and
an imaging optics of claim 12.

22. The imaging optics of claim 12, wherein the opening is in the second to last mirror.

23. An imaging optics, comprising:
a plurality of mirrors configured to image an object field in an object plane into an image field in an image plane along a beam path of imaging light,
wherein:
the imaging optics has an entrance pupil plane that lies in the beam path of the imaging light between 5 m and 2000 m in front of the object plane;
the plurality of mirrors are configured to image a center point of the object field into a center point of the image field;
the plurality of mirrors comprises a second to last mirror along the beam path of imaging light;
the second to last mirror has an opening configured to allow the imaging light to pass therethrough;
an axis passes through a center of the opening of the second to last mirror in a direction perpendicular to the image plane;
the center point of the image field lies on the axis; and
the imaging optics is configured to be used in micro-lithography.

24. An imaging optics, comprising:
a plurality of mirrors configured to image an object field in an object plane into an image field in an image plane along a beam path of imaging light,
wherein:
the imaging optics has an entrance pupil plane that lies in the beam path of the imaging light between 100 mm and 5000 mm in front of the object plane;
the plurality of mirrors are configured to image a center point of the object field into a center point of the image field;
the plurality of mirrors comprises a second to last mirror along the beam path of imaging light;
the second to last mirror has an opening configured to allow the imaging light to pass therethrough;

a reflection surface of at least one of the mirrors is a freeform surface;
an axis passes through a center of the opening of the second to last mirror in a direction perpendicular to the image plane;
the center point of the image field lies on the axis; and
the imaging optics is configured to be used in microlithography.

* * * * *

UNITED STATES PATENT AND TRADEMARK OFFICE
CERTIFICATE OF CORRECTION

PATENT NO. : 9,442,386 B2
APPLICATION NO. : 13/006025
DATED : September 13, 2016
INVENTOR(S) : Mann Page 1 of 1

It is certified that error appears in the above-identified patent and that said Letters Patent is hereby corrected as shown below:

In the Specification

Column 5, Line 17, after "The", delete "the".

Signed and Sealed this
Third Day of January, 2017

Michelle K. Lee
*Director of the United States Patent and Trademark Office*